United States Patent
Yi

(10) Patent No.: US 10,626,492 B2
(45) Date of Patent: Apr. 21, 2020

(54) MASK ASSEMBLY FOR THIN FILM DEPOSITION AND METHOD OF MANUFACTURING THE SAME

(71) Applicant: Samsung Display Co., Ltd., Yongin-si (KR)

(72) Inventor: Sangmin Yi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/352,832

(22) Filed: Mar. 14, 2019

(65) Prior Publication Data

US 2019/0233932 A1    Aug. 1, 2019

Related U.S. Application Data

(62) Division of application No. 15/630,206, filed on Jun. 22, 2017, now Pat. No. 10,266,935.

(30) Foreign Application Priority Data

Jun. 24, 2016 (KR) .................. 10-2016-0079281

(51) Int. Cl.
*C23C 14/04* (2006.01)
*C23C 14/18* (2006.01)
*C23F 1/00* (2006.01)

(52) U.S. Cl.
CPC .......... *C23C 14/042* (2013.01); *C23C 14/185* (2013.01); *C23F 1/00* (2013.01)

(58) Field of Classification Search
USPC ........................................................ 118/721
See application file for complete search history.

(56) References Cited

U.S. PATENT DOCUMENTS

| 7,185,419 B2 * | 3/2007 | Kang .................. C25D 1/10 118/213 |
| 2002/0059903 A1 * | 5/2002 | Hasegawa ............. C23C 14/042 118/504 |
| 2009/0137180 A1 | 5/2009 | Sung et al. |
| 2009/0151630 A1 * | 6/2009 | Marcanio ............. C23C 14/042 118/504 |

(Continued)

FOREIGN PATENT DOCUMENTS

| JP | 2006-144120 | 6/2006 |
| JP | 2006-188732 | 7/2016 |

(Continued)

OTHER PUBLICATIONS

Non-Final Office Action dated Sep. 7, 2018, in U.S. Appl. No. 15/630,206.

*Primary Examiner* — Roberts P Culbert

(74) *Attorney, Agent, or Firm* — H.C. Park & Associates, PLC

(57) ABSTRACT

A mask assembly for thin film deposition and a method of manufacturing the same. The mask assembly includes a glass mask having a first surface and a second surface opposite the first surface, a first metal layer patterned above the first surface of the glass mask, and a second metal layer patterned below the second surface of the glass mask. A plurality of deposition areas are arranged on the glass mask, and a plurality of deposition pattern portions each having a plurality of slits are patterned in the plurality of deposition areas.

14 Claims, 7 Drawing Sheets

(56) References Cited

U.S. PATENT DOCUMENTS

| | | | |
|---|---|---|---|
| 2010/0192856 A1* | 8/2010 | Sung | C23C 14/042 118/721 |
| 2011/0067630 A1* | 3/2011 | Ko | C23C 14/042 118/721 |
| 2016/0079532 A1* | 3/2016 | Yi | H01L 51/0002 438/758 |

FOREIGN PATENT DOCUMENTS

| | | |
|---|---|---|
| KR | 10-2002-0082962 | 11/2002 |
| KR | 10-2002-0091725 | 12/2002 |
| KR | 10-2003-0081736 | 10/2003 |
| KR | 10-2005-0038386 | 4/2005 |
| KR | 10-2009-0053418 | 5/2009 |
| KR | 10-2009-0098141 | 9/2009 |
| KR | 10-2009-0124356 | 12/2009 |
| KR | 10-2011-0032284 | 3/2011 |
| KR | 10-2014-0132520 | 11/2014 |
| KR | 10-2016-0033337 | 3/2016 |

* cited by examiner

MASK ASSEMBLY FOR THIN FILM DEPOSITION AND METHOD OF MANUFACTURING THE SAME

CROSS-REFERENCE TO RELATED APPLICATION

This application is a Divisional of U.S. patent application Ser. No. 15/630,206, filed on Jun. 22, 2017, and claims priority from and the benefit of Korean Patent Application No. 10-2016-0079281, filed on Jun. 24, 2016, which is hereby incorporated by reference for all purposes as if fully set forth herein.

BACKGROUND

Field

Exemplary embodiments relate to a mask assembly for thin film deposition and a method of manufacturing the same.

Discussion of the Background

Display apparatuses are used in various kinds of mobile apparatuses, such as smartphones, laptop computers, digital cameras, camcorders, portable information terminals, notebooks, and tablet personal computers (PCs), or in electronic devices, such as desktop computers, televisions (TVs), outdoor billboards, exhibition display devices, dashboards, and head-up displays (HUDs).

A light-emission layer patterned in a display apparatus may be formed by using various methods. A deposition method refers to a method of depositing a deposition material on a substrate by using a mask having the same pattern as that of a thin film to be deposited.

The mask may be mounted on a mask frame. A certain pressure is applied to the mask at the time of mounting the mask. As a result of such a pressure, the mask may be deformed. Accordingly, the mask may be misaligned with the substrate, and precise patterning may not be performed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask assembly for thin film deposition, which is capable of providing precise deposition patterns, and a method of manufacturing the same.

Additional aspects will be set forth in part in the description which follows and, in part, will be apparent from the description, or may be learned by practice of the inventive concept.

An exemplary embodiment discloses a mask assembly for thin film deposition, including: a glass mask having a first surface and a second surface opposite the first surface; a first metal layer patterned above the first surface of the glass mask; and a second metal layer patterned below the second surface of the glass mask, wherein a plurality of deposition areas are arranged on the glass mask, and a plurality of deposition pattern portions each having a plurality of slits are patterned in the plurality of deposition areas.

The plurality of deposition areas may be respectively arranged in openings penetrating the glass mask and spaced apart from one another in the glass mask.

The deposition areas may correspond to an active area of a substrate on which a deposition material is to be deposited, and a plurality of slit patterns of each of the deposition pattern portions may correspond to a plurality of light-emission layer patterns arranged in the active area.

The first metal layer may extend from the first surface of the glass mask toward the deposition area, and the plurality of slits may be patterned in the first metal layer corresponding to the deposition areas.

Each opening in the second surface of the glass mask may be larger than each opening in the first surface of the glass mask.

The opening in the first surface of the glass mask may correspond to the deposition area.

A second diameter of each opening in the second surface of the glass mask may be greater than a first diameter of each opening in the first surface of the glass mask.

An inner peripheral wall of the glass mask surrounding each opening may be inclined.

A diameter of the inner peripheral wall of the glass mask may be gradually increased from the first surface to the second surface of the glass mask.

A rib that connects portions of the glass mask may be arranged between adjacent deposition areas.

The first metal layer may include a plurality of stacked conductive layers.

The first surface of the glass mask may be a surface facing a substrate on which a deposition material is to be deposited, and the second surface of the glass mask may be a surface on which a deposition material emitted from a deposition source is incident.

A support stick may be further arranged below the glass mask.

The glass mask may be a mother mask on which a plurality of deposition pattern portions are arranged in a plurality of deposition areas.

The glass mask may include a plurality of stick masks, and each of the stick masks may include a plurality of deposition pattern portions arranged in the plurality of deposition areas.

An exemplary embodiment also discloses, a method of manufacturing a mask assembly for thin film deposition, including: preparing a glass mask; patterning a metal layer on both a first surface and a second surface of the glass mask to form a plurality of deposition pattern portions; and removing a part of the glass mask to form an opening in a region corresponding to a deposition area in which the deposition pattern portions are patterned.

The method may further include: forming a first metal layer above the first surface of the glass mask and forming a second metal layer below the second surface of the glass mask; etching the first metal layer and the second metal layer; and patterning a plurality of slits in a region corresponding to each deposition pattern portion in which the first metal layer is to be formed, and performing etching so that an opening larger than the deposition area is formed in the second metal layer.

The first metal layer and the second metal layer may be patterned by plating or sputtering.

The glass mask may be etched from the second surface of the glass mask to form an opening larger than the deposition area through the region in which the second metal layer is etched.

Portions of the glass mask surrounding adjacent deposition areas may be connected to each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
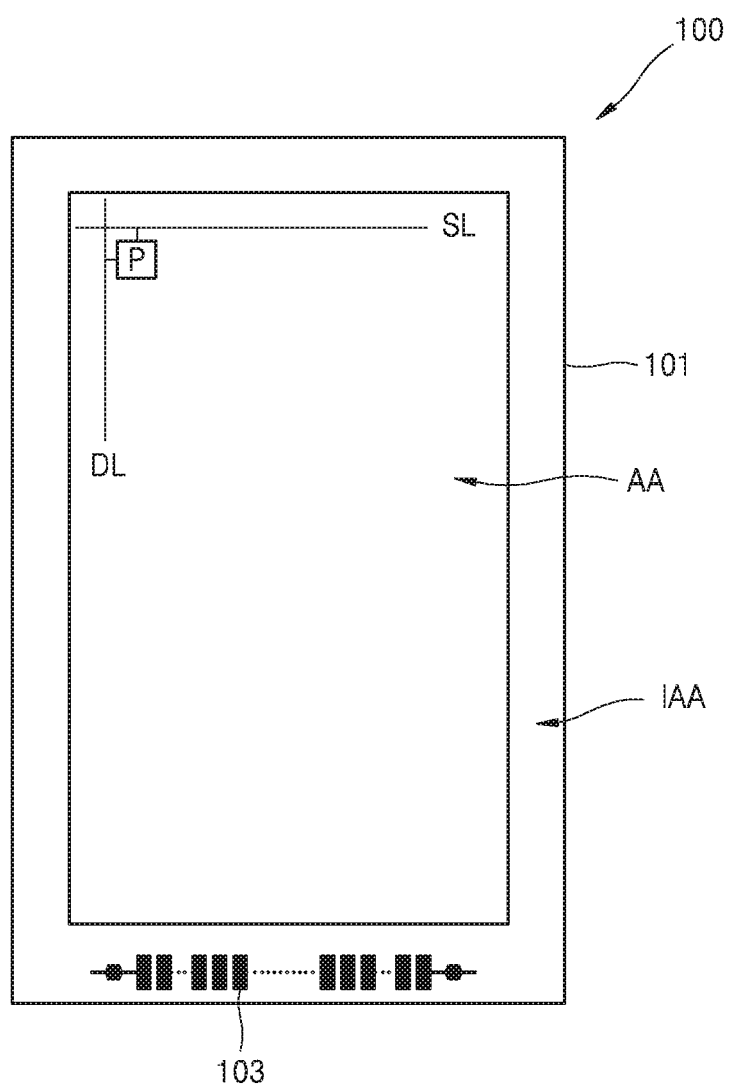
FIG. 1 is a schematic plan view of a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
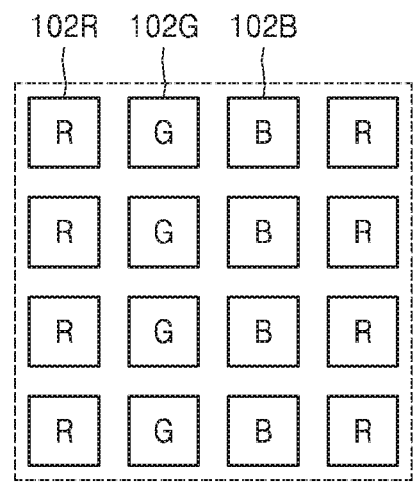
FIG. 2 is a schematic enlarged plan view of a light-emission layer in an active area of FIG. 1.

FIG. 1 is a schematic plan view of a display apparatus 100 according to an exemplary embodiment, and FIG. 2 is a schematic enlarged plan view of a light-emission layer in an active area AA of FIG. 1.

Referring to FIGS. 1 and 2, a substrate 101 may include various materials. The substrate 101 may include a glass material containing $SiO_2$ as a main component. The substrate 101 is not limited thereto, and the substrate 101 may include plastic.

The substrate 101 has an active area AA on which an image is displayed, and an inactive area IAA extending outward from the active area AA.

A plurality of pixels P may be arranged in the active area AA. The pixels P may be arranged at the intersections of data lines DL and scan lines SL. Red light-emission layers 102R, green light-emission layers 102G, and blue light-emission layers 102B may be arranged in the pixels P. These light-emission layers may provide various color combinations.

The red light-emission layers 102R, the green light-emission layers 102G, and the blue light-emission layers 102B in the active area AA may be patterned by using a deposition mask.

A power supply (not illustrated) or a pad portion 103 configured to transfer an electrical signal from a signal generator (not illustrated) to the active area AA may be arranged in the inactive area IAA.

Figure 3:
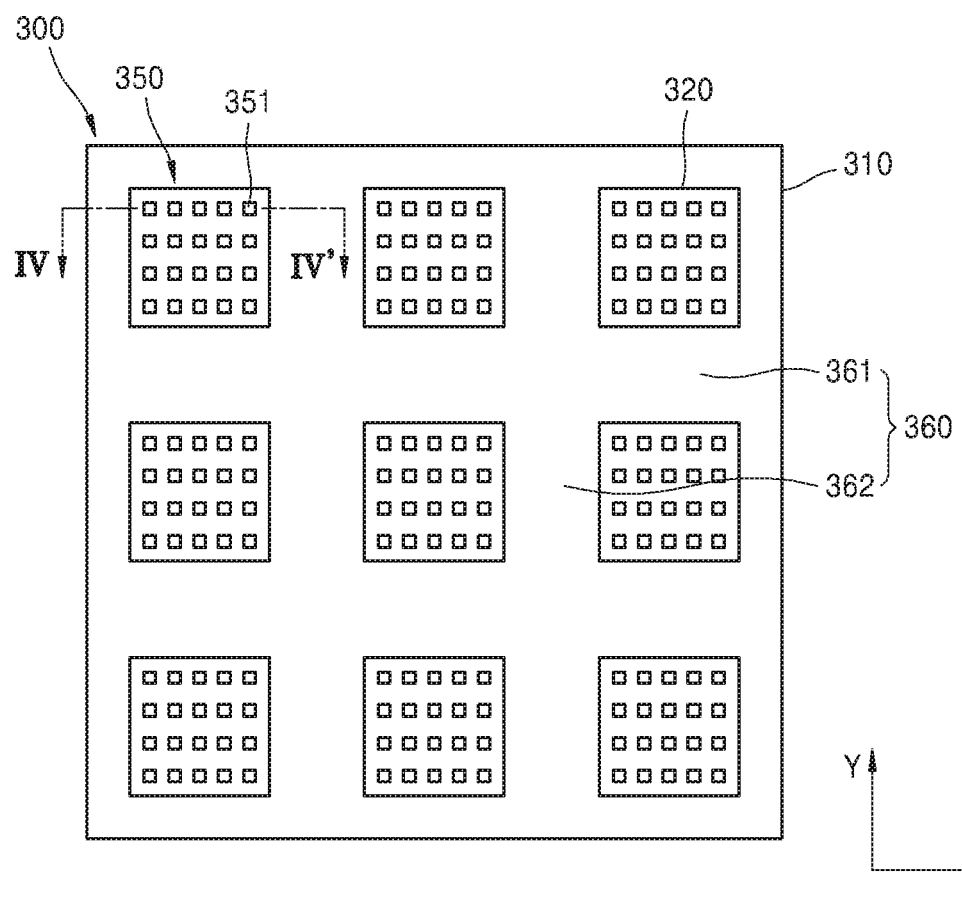
FIG. 3 is a schematic plan view of a mask assembly according to an exemplary embodiment.
Figure 4:
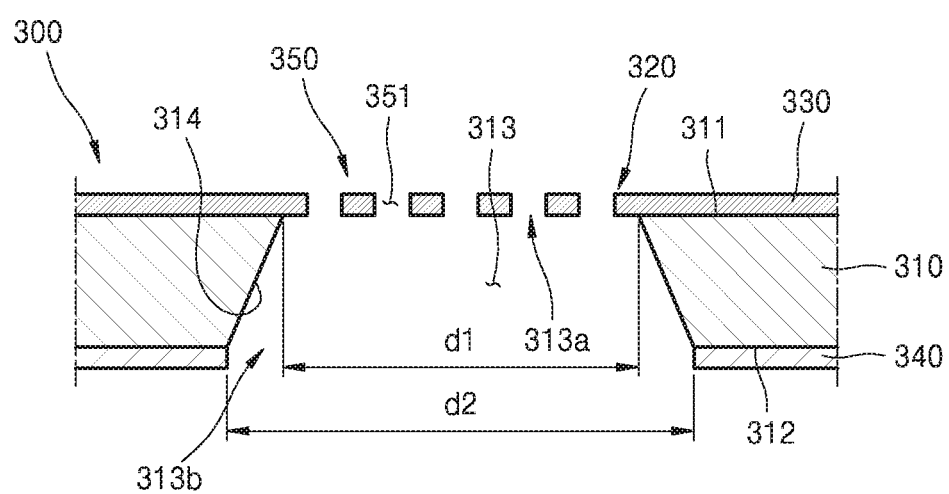
FIG. 4 is a cross-sectional view taken along a line IV-IV' of FIG. 3.
Figure 5:
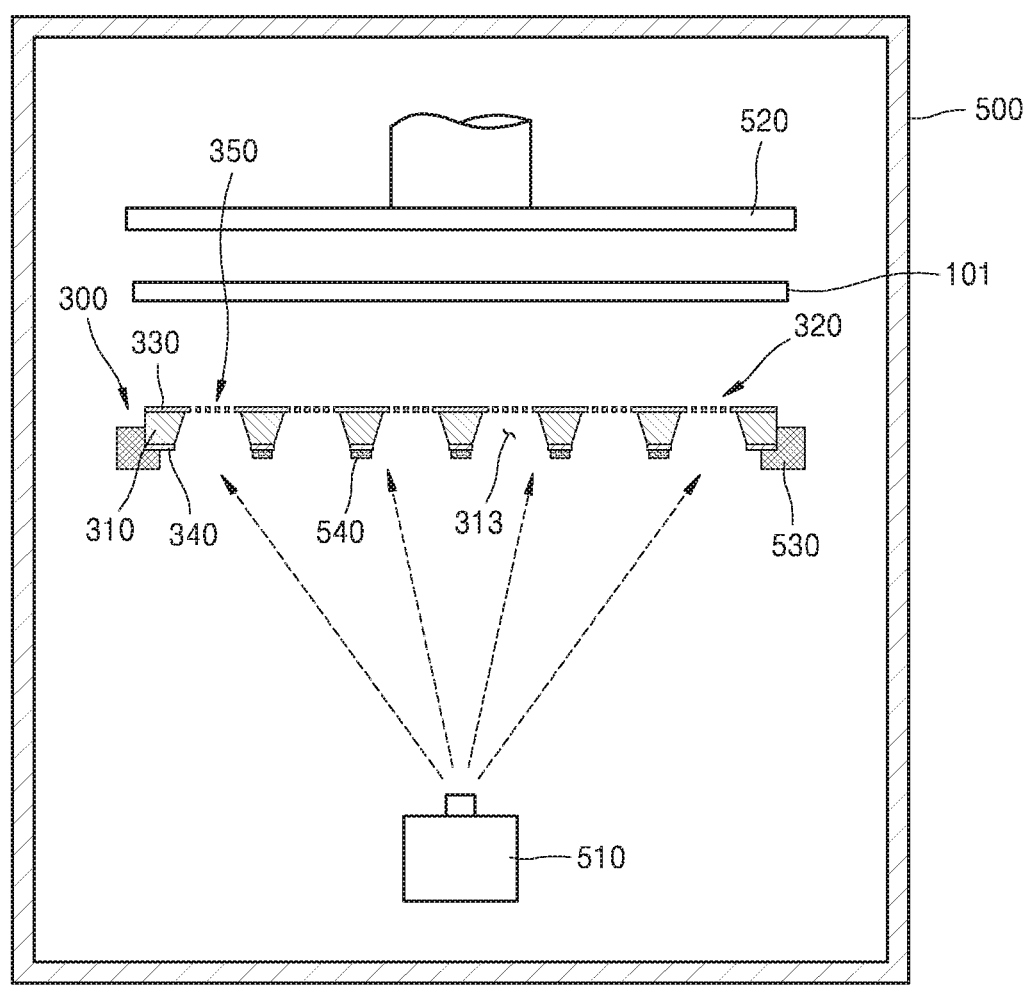
FIG. 5 is a configuration diagram for describing a deposition process using the mask assembly of FIG. 3.

FIG. 3 is a schematic plan view of a mask assembly 300 according to an exemplary embodiment, FIG. 4 is a cross-sectional view taken along line IV-IV' of FIG. 3, and FIG. 5 is a configuration diagram for describing a deposition process using the mask assembly 300 of FIG. 3.

Referring to FIGS. 3 to 5, the mask assembly 300 includes a glass mask 310. The glass mask 310 may include a glass material. In an exemplary embodiment, the glass mask 310 may include the same material as that of the substrate 101 that is a deposition target. In an exemplary embodiment, the glass mask 310 may be a silicon wafer.

The glass mask 310 has a first surface 311 and a second surface 312 opposite the first surface 311. The first surface 311 of the glass mask 310 may be a surface facing the substrate 101 on which a deposition material is to be deposited. The second surface 312 of the glass mask 310 may be a surface on which a deposition material emitted from a deposition source 510 is incident. A first metal layer 330 may be patterned on the first surface 311 of the glass mask 310. A second metal layer 340 may be patterned on the second surface 312 of the glass mask 310.

A plurality of deposition areas 320 may be arranged in the glass mask 310. The deposition areas 320 may be spaced apart at certain intervals in X and Y directions of the glass mask 310. The deposition areas 320 may correspond to the active area (AA of FIG. 1) of the substrate 101 on which the deposition material emitted from the deposition source 510 is to be deposited.

Deposition pattern portions 350 may be arranged in the deposition areas 320. A plurality of slits 351 may be patterned in the deposition pattern portion 350. The plurality of slits 351 may correspond to the plurality of light-emission layers (102R, 102G, and 102B of FIG. 2) patterned in the active area AA of the substrate 101.

A plurality of openings 313 may be formed in the glass mask 310. The openings 313 may penetrate the glass mask 310 in a thickness direction. The openings 313 may be spaced apart at certain intervals in X and Y directions of the glass mask 310. The deposition areas 320 may be arranged in the openings 313.

The first metal layer 330 may extend from the first surface 311 of the glass mask 310 to the deposition areas 320. For example, the first metal layer 330 may cover the first surface 311 of the glass mask 310. In an exemplary embodiment, the first metal layer 330 may entirely cover the first surface 311 of the glass mask 310. The slits 351 may be patterned in the first metal layer 330 extending to the deposition areas 320. The slits 351 may be patterned by wet etching or dry etching.

The second metal layer 340 may be arranged below the second surface 312 of the glass mask 310. In an exemplary embodiment, the second metal layer 340 may entirely cover the second surface 312 of the glass mask 310.

The opening 313b in the second surface 312 of the glass mask 310 may be larger than the opening 313a in the first surface 311 of the glass mask 310. For example, a second diameter d2 of the opening 313b in the second surface 312 of the glass mask 310 may be greater than a first diameter d1 of the opening 313a in the first surface 311 of the glass mask 310. In an exemplary embodiment, the opening 313a in the first surface 311 of the glass mask 310 may correspond to the deposition area 320.

Since the opening 313b in the second surface 312 of the glass mask 310 is larger than the opening 313a in the first surface 311 of the glass mask 310 that corresponds to the deposition area 320, the deposition material emitted from the deposition source 510 may be deposited to have a desired pattern in the active area AA of the substrate 101 even though a part of the deposition material is deposited in an unintended area of the glass mask 310 while moving through the opening 313.

In an exemplary embodiment, the opening 313 of the glass mask 310 may have a dot shape or a stripe shape.

An inner peripheral wall 314 of the glass mask 310 surrounding the opening 313 may be inclined. Specifically, since the diameter d1 of the opening 313a in the first surface 311 of the glass mask 310 is less than the diameter d2 of the opening 313b in the second surface 312 of the glass mask 310, the inner peripheral wall 314 of the glass mask 310 may be inclined at a certain angle. For example, the diameter of the inner peripheral wall 314 of the glass mask 310 may be gradually widened from the first surface 311 of the glass mask 310 toward the second surface 312 of the glass mask 310.

The deposition areas 320 may be arranged throughout the glass mask 310. The deposition areas 320 may be arranged in the openings 313 of the glass mask 310, and a rib 360 may be arranged between each of the adjacent deposition areas 320 so as to connect portions of the glass mask 310 to each other. The rib 360 provides rigidity to the glass mask 310.

The rib 360 includes a plurality of first ribs 361 crossing a region between the deposition areas 320 spaced apart in the Y direction, and a plurality of second ribs 362 crossing a region between the deposition areas 320 spaced apart in the X direction. The first ribs 361 may be connected to the second ribs 362.

In an exemplary embodiment, the glass mask 310 may be the mother mask on which the plurality of deposition pattern portions 350 are patterned in the plurality of deposition areas 320. The deposition area 320 in which the deposition pattern portion 350 is formed may correspond to the active area AA of the individual display apparatus. For convenience of manufacturing, a plurality of deposition areas 320 in which a plurality of deposition pattern portions 350 may be patterned on one mother mask so as to manufacture a plurality of display apparatuses at the same time.

Figure 6:
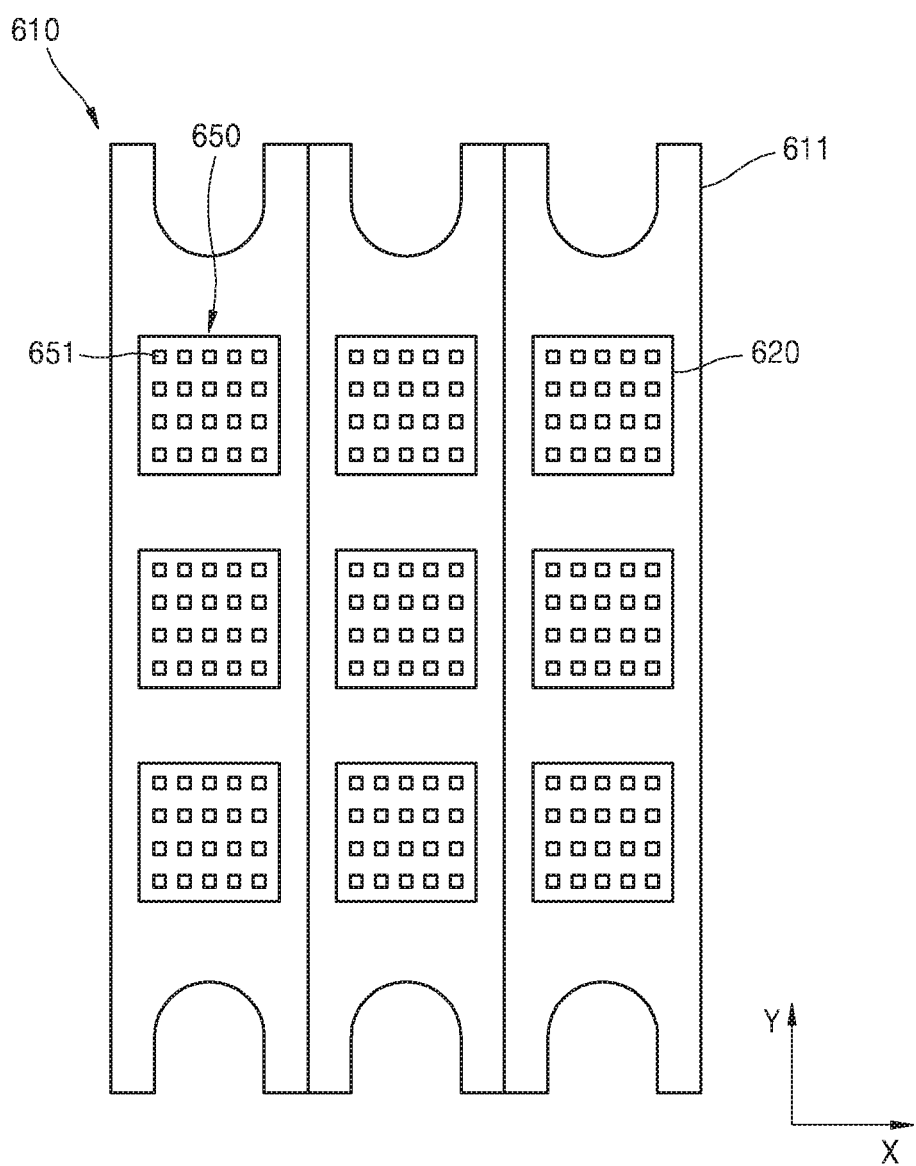
FIG. 6 is a schematic plan view of a mask assembly according to another exemplary embodiment.

In an exemplary embodiment, the glass mask 310 may be a stick mask. Referring to FIG. 6, a glass mask 610 includes a plurality of stick masks 611.

The stick masks 611 may be continuously arranged in a width direction (X direction). In each of the stick masks 611, deposition areas 620 may be spaced apart in a length direction (Y direction). Deposition pattern portions 650 may be arranged in the deposition areas 620. A plurality of slits 651 may be patterned in the deposition pattern portion 650.

In an exemplary embodiment, a metal layer patterned on the glass mask may have a structure in which a plurality of conductive layers are stacked.

Figure 7:
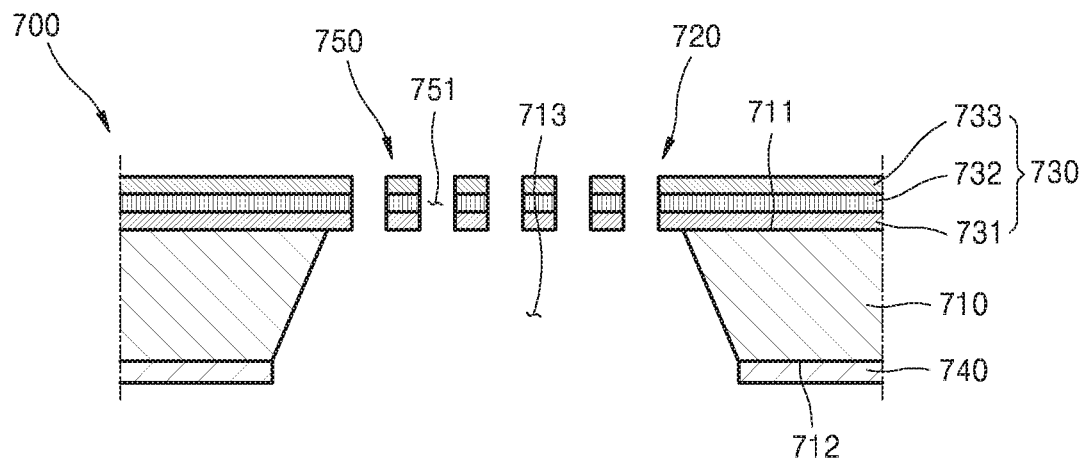
FIG. 7 is a cross-sectional view of a mask assembly according to another exemplary embodiment.

Referring to FIG. 7, a deposition area 720 may be arranged in a glass mask 710. The deposition area 720 may be arranged in an opening 713 penetrating the glass mask 710. A deposition pattern portion 750 in which a plurality of slits 751 are patterned may be arranged in the deposition area 720.

A first metal layer 730 may be arranged above a first surface 711 of the glass mask 710. A second metal layer 740 may be arranged below a second surface 712 of the glass mask 710. The substrate 101 of FIG. 5, on which a deposition material is to be deposited, and the magnet 520 of FIG. 5, which is arranged above the substrate 101, may be arranged above the first surface 711 of the glass mask 710.

The first metal layer 730 includes a first conductive layer 731 patterned above the first surface 711 of the glass mask 710, a second conductive layer 732 patterned above the first conductive layer 731, and a third conductive layer 733 patterned above the second conductive layer 732.

The first conductive layer 731, the second conductive layer 723, and the third conductive layer 733 may be layers that perform various functions of the mask assembly 700. For example, the first metal layer 730 may include a conductive layer 731 that prevents the first metal layer 730 from being corroded during a process of etching the glass mask 710, a conductive layer 732 that is easily deposited above the glass mask 710, or a conductive layer 733 that is easily connected to the magnet 520. The first metal layer 731 including the plurality of conductive layers 731 to 733 may provide a combination of various functional layers.

A deposition process using the mask assembly 300 will be described with reference to FIGS. 3 to 5.

The mask assembly 300 is loaded into a vacuum chamber 500 for depositing a thin film such as an organic emissive layer of an organic light-emitting display apparatus.

A deposition source 510 may be disposed in a lower portion of the vacuum chamber 500. The mask assembly 300 may be arranged above the deposition source 510. The mask assembly 300 includes the glass mask 310 and the first and second metal layers 330 and 340 patterned above both surfaces of the glass mask 310. Unlike in the related art, the mask assembly 300 does not require a mask frame. The mask assembly 300 may be mounted on a support block 530 installed in the chamber 500.

The deposition substrate 101 may be arranged above the mask assembly 300. The magnet 520 may be arranged above the deposition substrate 101 to generate a magnetic force so that the mask assembly 300 closely contacts the deposition substrate 101.

A support stick 540 may be installed under the glass mask 310 so as to prevent sagging of the glass mask 310. The support stick 540 may be arranged in the rib 360 of the glass mask 310.

When the deposition material of the deposition source 510 is sprayed toward the mask assembly 300, the deposition material moving through the opening 313 of the glass mask 310 may pass through the slits 351 of the deposition pattern portion 350 formed in the deposition area 320 and be deposited to have a desired pattern above one surface of the deposition substrate 101.

FIGS. 8A to 8D are cross-sectional views for describing a method of manufacturing the mask assembly 300 of FIG. 3, according to an exemplary embodiment.

Figure 8A:
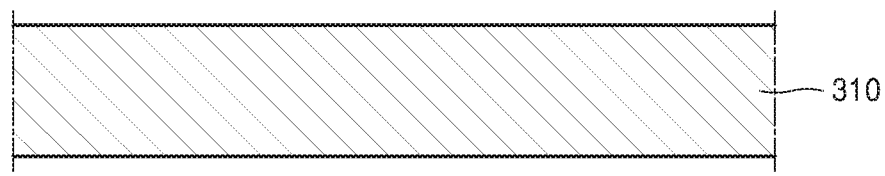
FIG. 8A is a cross-sectional view illustrating a state after a glass mask of FIG. 3 is prepared.

Referring to FIG. 8A, a glass mask 310 is prepared. The glass mask 310 may include a glass material. In an exemplary embodiment, the glass mask 310 may be a silicon wafer. The glass mask 310 may be a mother mask.

Figure 8B:
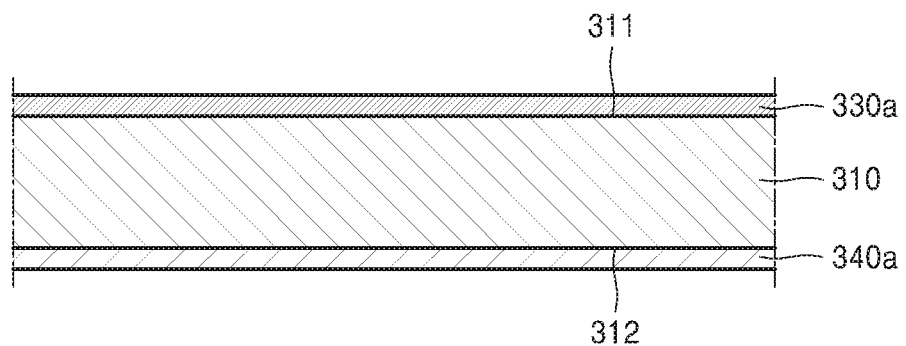
FIG. 8B is a cross-sectional view illustrating a state after metal layers are formed on both surfaces of the glass mask of FIG. 8A.

As illustrated in FIG. 8B, a first metal layer 330a and a second metal layer 340a are respectively formed on opposing first and second surfaces 311, 312 of the glass mask 310. The first metal layer 330a is formed above a first surface 311 of the glass mask 310, and the second metal layer 340b is formed below a second surface 312 of the glass mask 310. The first metal layer 330a and the second metal layer 340b may be formed by plating or sputtering.

Figure 8C:
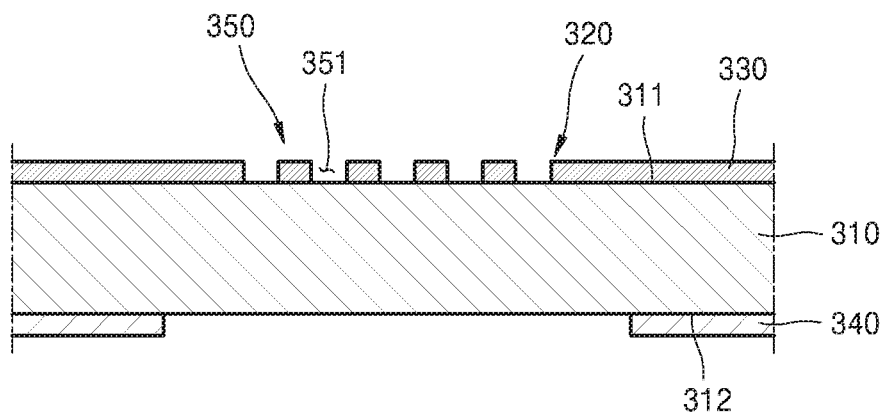
FIG. 8C is a cross-sectional view illustrating a state after patterns are formed in the metal layers of FIG. 8B.

As illustrated in FIG. 8C, a first metal pattern 330 and a second metal pattern 340 are formed by performing a photolithography process on both surfaces of the glass mask 310. For example, the first metal layer 330a above the first surface 311 of the glass mask 310 is etched to form a plurality of slits 351 in a region corresponding to each deposition pattern portion 350 in which the first metal pattern 330 is to be formed. The second metal layer 340a may be etched to form an opening larger than the deposition area 320 in the second surface 312 of the glass mask 310.

Figure 8D:
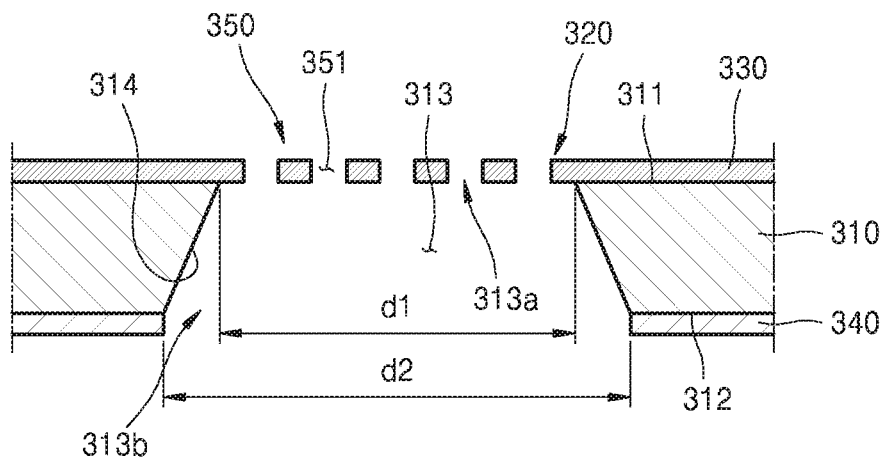
FIG. 8D is a cross-sectional view illustrating a state after an opening is formed in the glass mask of FIG. 8B.

As illustrated in FIG. 8D, a part of the glass mask 310 is removed to form an opening 313 in the region corresponding to the deposition area 320. In the etching process, an etchant etches the glass mask 310 from the second surface 312 of the glass mask 310. Since the second metal pattern 340 having an opening larger than the deposition area 320 is formed on the second surface 312 of the glass mask 310, the etchant may form an opening 313 larger than the deposition area 320 through the region in which the second metal layer 340a is etched. By adjusting an etching rate, a second diameter d2 of the opening 313b in the second surface 312 of the glass mask 310 may be greater than a first diameter d1 of the opening 313a in the first surface 311 of the glass mask 310.

Adjacent deposition areas 320 are connected to each other by a first rib 361 and a second rib 362 for connecting portions of the glass mask 310.

The mask assembly for the thin film deposition and the method of manufacturing the same, according to an exemplary embodiment, are capable of minimizing a position change caused by thermal deformation of the glass mask, thus improving positional accuracy between the mask and the substrate. Furthermore, the pattern thickness of the metal layer arranged above the glass mask may be easily controlled, thus achieving precision patterning.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask assembly for thin film deposition, the mask assembly comprising:
   a glass mask comprising a first surface and a second surface opposite the first surface;
   a first metal layer patterned above the first surface of the glass mask; and a second metal layer patterned below the second surface of the glass mask,
wherein:
a plurality of deposition areas are arranged on the glass mask;
a plurality of deposition pattern portions, each comprising a plurality of slits, are patterned in the deposition areas;
the deposition areas are respectively arranged in openings penetrating the glass mask and spaced apart from one another in the glass mask;
the first metal layer comprises a plurality of first openings defining each of the plurality of deposition pattern portions;
the second metal layer comprises a plurality of second openings each corresponding to one of the openings in the second surface of the glass mask; and
each of the plurality of second openings is larger than each of the plurality of first openings.

2. The mask assembly of claim 1, wherein the deposition areas correspond to an active area of a substrate on which a deposition material is to be deposited, and a plurality of slit patterns of each of the deposition pattern portions correspond to a plurality of light-emission layer patterns arranged in the active area.

3. The mask assembly of claim 1, wherein the first metal layer extends from the first surface of the glass mask toward the deposition area, and the slits are patterned in the first metal layer corresponding to the deposition areas.

4. The mask assembly of claim 1, wherein each opening in the second surface of the glass mask is larger than each opening in the first surface of the glass mask.

5. The mask assembly of claim 4, wherein each opening in the first surface of the glass mask corresponds to each deposition area.

6. The mask assembly of claim 4, wherein a second diameter of each opening in the second surface of the glass mask is greater than a first diameter of each opening in the first surface of the glass mask.

7. The mask assembly of claim 5, wherein an inner peripheral wall of the glass mask surrounding each opening is inclined.

8. The mask assembly of claim 7, wherein a diameter of the inner peripheral wall of the glass mask is gradually increased from the first surface to the second surface of the glass mask.

9. The mask assembly of claim 1, wherein a rib that connects portions of the glass mask is arranged between adjacent deposition areas.

10. The mask assembly of claim 1, wherein the first metal layer comprises a plurality of stacked conductive layers.

11. The mask assembly of claim 1, wherein the first surface of the glass mask is a surface facing a substrate on which a deposition material is to be deposited, and the second surface of the glass mask is a surface on which a deposition material emitted from a deposition source is incident.

12. The mask assembly of claim 1, wherein a support stick is further arranged below the glass mask.

13. The mask assembly of claim 1, wherein the glass mask is a mother mask on which a plurality of deposition pattern portions are arranged in a plurality of deposition areas.

14. The mask assembly of claim 1, wherein:
the glass mask comprises a plurality of stick masks; and
each of the stick masks comprises a plurality of deposition pattern portions arranged in a plurality of deposition areas.

* * * * *